United States Patent
Ramalingam et al.

(10) Patent No.: US 10,275,156 B2
(45) Date of Patent: Apr. 30, 2019

(54) MANAGING SOLID STATE DRIVE DEFECT REDUNDANCIES AT SUB-BLOCK GRANULARITY

(71) Applicant: Intel Corporation, Santa Clara, CA (US)

(72) Inventors: Anand S. Ramalingam, Beaverton, OR (US); Jawad B. Khan, Cornelius, OR (US); Pranav Kalavade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/280,725

(22) Filed: Sep. 29, 2016

(65) Prior Publication Data

US 2018/0088823 A1    Mar. 29, 2018

(51) Int. Cl.
*G06F 3/06* (2006.01)
*G11C 16/16* (2006.01)
*G11C 16/34* (2006.01)
*G11C 16/04* (2006.01)

(52) U.S. Cl.
CPC .......... *G06F 3/0608* (2013.01); *G06F 3/0652* (2013.01); *G06F 3/0679* (2013.01); *G11C 16/0483* (2013.01); *G11C 16/16* (2013.01); *G11C 16/3445* (2013.01); *G06F 3/064* (2013.01); *G06F 3/0658* (2013.01); *G06F 3/0659* (2013.01)

(58) Field of Classification Search
CPC ... G11C 16/3445; G11C 16/16; G06F 3/0679; G06F 3/0659; G06F 3/0658; G06F 3/0652; G06F 3/064; G06F 3/0608
See application file for complete search history.

(56) References Cited

U.S. PATENT DOCUMENTS

| | | | | |
|---|---|---|---|---|
| 8,527,819 B2* | 9/2013 | Shalvi | ......... | G11C 16/344 |
| | | | | 714/710 |
| 9,047,187 B2* | 6/2015 | Guo | ......... | G06F 11/073 |
| 9,286,198 B2* | 3/2016 | Bennett | ......... | G06F 12/00 |
| 9,312,026 B2* | 4/2016 | Kochar | ......... | G11C 16/3445 |
| 9,455,048 B2* | 9/2016 | Berckmann | ......... | G11C 29/88 |
| 2001/0019501 A1 | 9/2001 | Otani et al. | | |
| 2010/0174849 A1 | 7/2010 | Walston et al. | | |
| 2012/0051136 A1* | 3/2012 | Kang | ......... | G11C 16/16 |
| | | | | 365/185.17 |
| 2014/0310447 A1 | 10/2014 | Chang et al. | | |
| 2016/0055918 A1 | 2/2016 | Kochar et al. | | |
| 2016/0260496 A1 | 9/2016 | Yoon et al. | | |

OTHER PUBLICATIONS

International Search Report and Written Opinion for International Patent Application No. PCT/US2017/049179, dated Dec. 11, 2017, 12 pages.

* cited by examiner

*Primary Examiner* — Vanthu T Nguyen
(74) *Attorney, Agent, or Firm* — Jordan IP Law, LLC

(57) ABSTRACT

Systems, apparatuses and methods may provide for initiating an erase of a block of non-volatile memory in response to an erase command, wherein the block includes a plurality of sub-blocks. Additionally, a failure of the erase with respect to a first subset of the plurality of sub-blocks may be tracked on an individual sub-block basis, wherein the erase is successful with respect to a second subset of the plurality of sub-blocks. In one example, use of the second subset of the plurality of sub-blocks is permitted, whereas use of the first subset of the plurality of sub-blocks is prevented.

24 Claims, 3 Drawing Sheets

10,275,156 B2

MANAGING SOLID STATE DRIVE DEFECT REDUNDANCIES AT SUB-BLOCK GRANULARITY

TECHNICAL FIELD

Embodiments generally relate to erasing memory structures.

BACKGROUND

NAND-type flash memory ("NAND memory") may be erased in blocks of memory. Developments in NAND lithography may have resulted in larger erase blocks that may be managed internally by the NAND memory in sub-blocks (e.g., 1/32 of a block). Under conventional solutions, however, a sub-block erase failure may cause the entire block to be treated as defective even though the NAND memory may be able to contain the failure to the sub-block in question. Accordingly, user exposable memory capacity may be wasted unnecessarily. Additionally, redundancy overhead (e.g., to protect against failure) may be relatively high due to the large size of the erase blocks.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

To retain write bandwidth in NAND-type flash memory ("NAND memory") semiconductor dies, the page size and erase block sizes may be increased. After each erase operation, the successful completion of the erase operation is verified by reading all targeted bits and ensuring that they are set to one. Upon failure of verification, an erase failure may be reported to indicate that the erase block is defective. With denser geometries, each erase block may be divided into a smaller number of sub-blocks (e.g., 32) and erase failures may be detected at the sub-block granularity. As will be discussed in greater detail, upon encountering erase failures, a non-volatile memory controller may detect the sub-block(s) that failed and mark the sub-block(s) as defective to prevent the storage of data to the failed sub-block(s).

Figure 1:
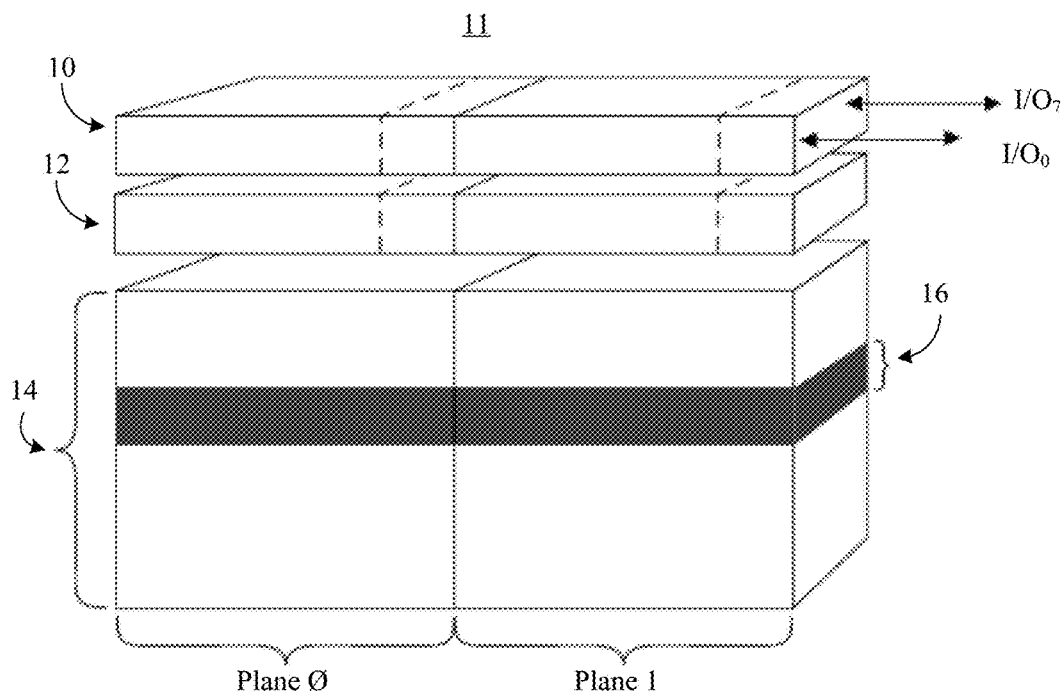
FIG. 1 is an illustration of an example of a NAND array organization according to an embodiment.

Turning now to FIG. 1, an array organization 11 for a non-volatile memory (NVM) such as, for example, NAND memory is shown. The illustrated array organization 11 may be used for a NAND flash memory, three-dimensional (3D) NAND memory array devices, or other memory devices. Non-volatile memory is a storage medium that does not require power to maintain the state of data stored by the medium. Non-limiting examples of nonvolatile memory may include any or a combination of: solid state memory (such as planar or 3D NAND flash memory or NOR flash memory), 3D crosspoint memory, storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org).

The array may be generally organized into a cache register 10, a data register 12 and a logical unit node (LUN) 14. The illustrated LUN 14 includes a certain number of blocks 16 (e.g., 2,048 blocks). The array may be further partitioned into multiple planes (e.g., "Plane 0", "Plane 1"), wherein each plane may include a certain number of blocks 16 (e.g., 1,024 blocks per plane). The size of a block 16 might be, for example, a certain number of pages (e.g., 512 pages) and each page may include a certain number of bytes (e.g., 16 k+1,216 bytes). Accordingly, each block 16 may be relatively large. As will be discussed in greater detail, each block 16 may include a plurality of sub-blocks, wherein erase failures may be contained at the sub-block level of granularity. Moreover, the erase failures may be tracked at the sub-block level so that exposure of available memory to users may be optimized and redundancy overhead may be minimized.

Figure 2:
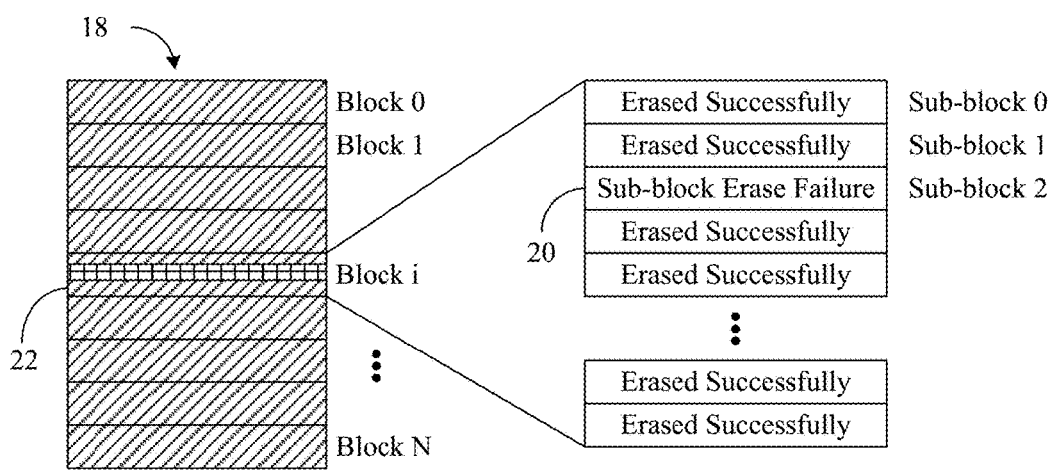
FIG. 2 is an illustration of an example of a sub-block erase failure according to an embodiment.

FIG. 2 shows an example in which a NAND memory 18 is organized into a plurality of blocks (i.e., "Block 0", "Block 1", . . . "Block N"). Each block also includes a plurality of sub-blocks that are individually tracked for success or failure of erase operations. In the illustrated example, an erase command that identifies a target block 22 (e.g., "Block i") results in a sub-block erase failure 20 (e.g., at "Sub-block 2"). Thus, the target block 22 may be considered as having two subsets of sub-blocks—a first subset with failed erases and a second subset with successful erases. By tracking the erase failures, more memory may be made available to users because the entire target block 22 need not be treated as defective/faulty. Although a single sub-block erase failure 20 is shown for ease of discussion, multiple (and non-contiguous) sub-block erase failures may be tracked per block as described herein. Tracking the erase failures may be conducted in several different ways, depending on the circumstances.

Figure 3:
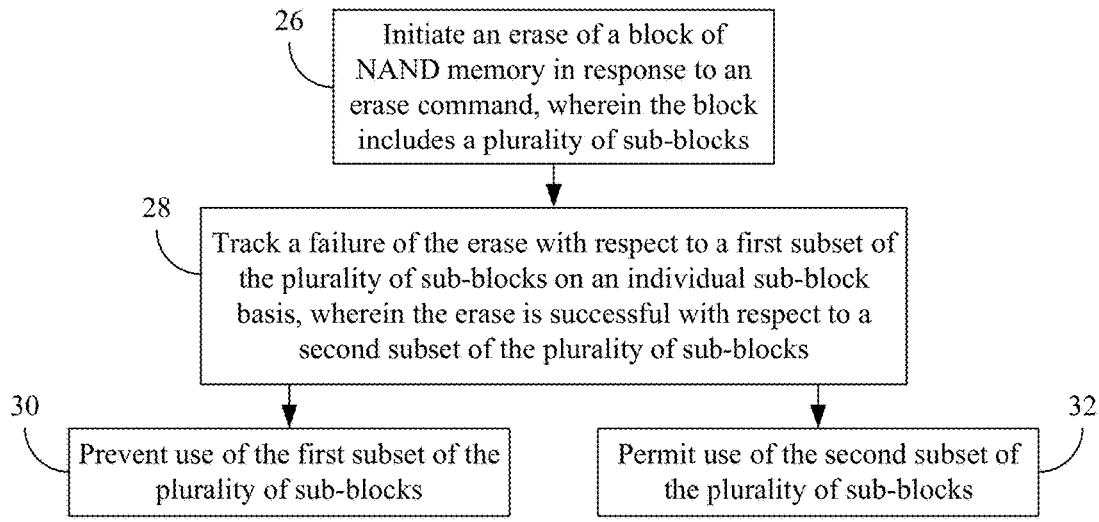
FIG. 3 is a flowchart of an example of a method of operating a memory device according to an embodiment.

FIG. 3 shows a method 24 of operating a memory device. The method 24 may generally be implemented in a memory device containing a NAND memory such as, for example, the NAND memory 18 (FIG. 2), having an array organization such as, for example, the array organization 11 (FIG. 1), already discussed. More particularly, the method 24 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

Illustrated processing block 26 provides for initiating an erase of a block of NAND memory in response to an erase command, wherein the block includes a plurality of sub-blocks. The erase command may identify the entire block of NAND memory (e.g., as a targeted "erase block"). Processing block 28 may track a failure of the erase with respect to a first subset of the plurality of sub-blocks on an individual sub-block basis, wherein the erase is successful with respect to a second subset of the plurality of sub-blocks. As already noted, the erase failures may be tracked in a number of different ways.

For example, processing block 28 may include transferring a new type of command such as, for example, an "erase status enhanced command" from a solid state drive (SSD) controller to the NAND memory (e.g., in response to receiving an erase failure from the NAND memory) and transferring an identification of each sub-block in the first subset from the NAND memory to the SSD controller in response to the erase status enhanced command.

Figure 4A:
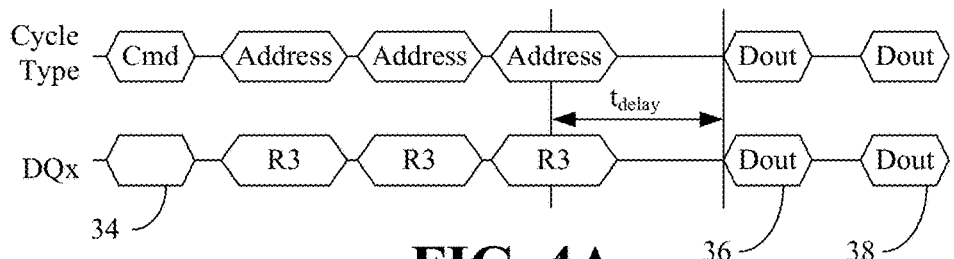
FIGS. 4A and 4B are signaling diagrams of examples of erase status enhanced command communications according to embodiments.

With continuing reference to FIGS. 3 and 4A, in another example, processing block 28 may include transferring an indication of the number of sub-blocks in the first subset and an identification of each sub-block in the first subset from the NAND memory to the SSD controller in a variable number of bytes. Thus, an erase status enhanced command 34 directed to a particular address may cause an initial output byte 36 from the NAND memory to contain the number of sub-block failures, wherein a subsequent output byte 38 identifies a particular sub-block having an erase failure. In the illustrated example, after a certain time delay ("$t_{delay}$"), the NAND will provide the sub-block failure information.

Figure 4B:
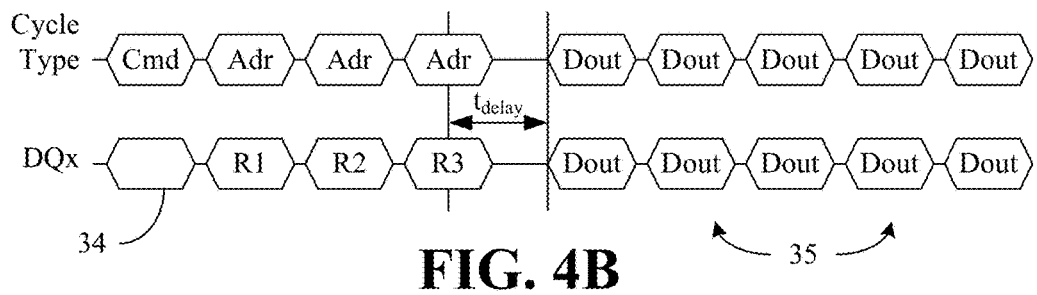

FIG. 4B demonstrates that the response to the erase status enhanced command 34 may be formed in a fixed number of bytes 35 in order to achieve a more deterministic result. Thus, five bytes might be returned, with the first output byte containing the total number of sub-blocks in error and the remaining four bytes indicating which sub-blocks encountered an error. In such a case, one's or zeroes may be packed into the 32 bits of the four bytes. Moreover, if no sub-blocks encountered erase errors, the first output byte may be zero, with subsequent bytes containing no useful information.

Returning now to FIG. 3, processing block 28 may also include documenting each sub-block in the first subset in a table such as, for example, an internal table of the SSD controller. In the illustrated example, use of the first subset of the plurality of blocks is prevented at processing block 30. Block 30 might include, for example, exposing the table of defective sub-blocks to a host platform and/or operating system (OS), generating a warning, etc., or any combination thereof. By contrast, illustrated block 32 permits use of the second subset of the plurality of sub-blocks. Block 32 may therefore result in more available memory being exposed. The illustrated method 24 may also enable a reduction in redundancy overhead (e.g., fewer XOR operations to calculate checksums).

Figure 5:
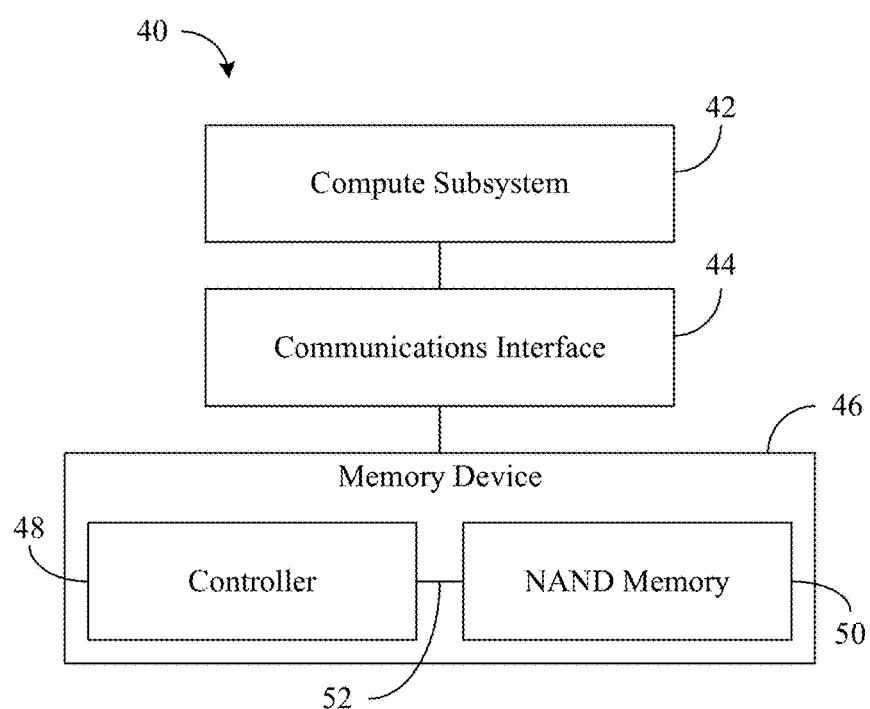
FIG. 5 is a block diagram of an example of a computing system according to an embodiment.

FIG. 5 shows a memory-based computing system 40. The system 40 may be part of a server (e.g., data center), desktop computer, notebook computer, tablet computer, convertible tablet, smart phone, personal digital assistant (PDA), media player, etc., or any combination thereof. The illustrated system 40 includes a compute subsystem 42 (e.g., host platform) and a communications interface 44 (e.g., switching fabric) coupled to the compute subsystem. The communications interface 44 may operate in compliance with, for example, NVMe (NVM Express) over PCIe (Peripheral Components Interconnect Express), SATA (Serial Advanced Technology Attachment), SAS (Serial Attached SCSI/Small Computer System Interface), PCIe, and so forth. In addition, a memory device 46 may be coupled to the communications interface 44. In one example, the memory device 46 is an SSD. The memory device 46 may generally implement one or more aspects of the method 24 (FIG. 3), already discussed. More particularly, the memory device 46 may include a NAND memory 50 such as, for example, the NAND memory 18 (FIG. 2), also already discussed.

The NAND memory 50 may initiate an erase of a block of the NAND memory 50 in response to an erase command (e.g., that identifies the block), wherein the block includes a plurality of sub-blocks. Additionally, a controller 48 (e.g., memory/host interface controller) may be communicatively coupled to the NAND memory 50 via an interface 52 such as, for an ONFI (Open NAND Flash Interface, e.g., ONFI 4.0, April 2014) bus. The controller 48, which may include firmware, may track a failure of the erase with respect to a first subset of the plurality of sub-blocks on an individual sub-block basis. The erase may be successful with respect to a second subset of the plurality of sub-blocks. The controller 48 may document each sub-block in the first subset in a table (e.g., an internal table), not shown.

In one example, the controller 48 is configured to transfer an erase status enhanced (ESE) command to the NAND memory 50 and the NAND memory 50 is configured to transfer an identification of each sub-block in the first subset to the controller 48 in response to the ESE command. In another example, the NAND memory 50 may transfer an indication of the number of sub-blocks in the first subset and an identification of each sub-block in the first subset to the controller 48 in a variable number of bytes. In yet another example, the NAND memory 50 may transfer the indication of the number of sub-blocks in the first subset and the identification of each sub-block in the first subset to the controller 48 in a fixed number of bytes.

The controller 48 may permit use of the second subset of the plurality of sub-blocks as well as prevent use of the first subset of the plurality of sub-blocks. Accordingly, the illustrated memory device 46 reduces redundancy overhead and minimizes the amount of storage that is excluded when defects occur.

ADDITIONAL NOTES AND EXAMPLES

Example 1 may include a memory-based computing system comprising a compute subsystem, a communications interface and a memory device coupled to the communications interface, the memory device including a non-volatile memory to initiate an erase block of a block of the non-volatile memory in response to a erase command, wherein the block is to include a plurality of sub-blocks, and a non-volatile memory controller communicatively coupled to non-volatile memory, the non-volatile memory controller to track a failure of the erase with respect to a first subset of the plurality of sub-blocks on an individual sub-block basis, wherein the erase is to be successful with respect to a second subset of the plurality of sub-blocks.

Example 2 may include the system of Example 1, wherein the non-volatile memory controller is to permit use of the second subset of the plurality of sub-blocks.

Example 3 may include the system of Example 1, wherein the non-volatile memory controller is to prevent use of the first subset of the plurality of sub-blocks.

Example 4 may include the system of Example 1, wherein the non-volatile memory controller is to transfer an erase status enhanced command to the non-volatile memory and the non-volatile memory is to transfer an identification of each sub-block in the first subset to the non-volatile memory controller in response to the erase status enhanced command.

Example 5 may include the system of Example 1, wherein the non-volatile memory is to transfer an indication of the number of sub-blocks in the first subset and an identification of each sub-block in the first subset to the non-volatile memory controller in a variable number of bytes.

Example 6 may include the system of Example 1, wherein the non-volatile memory is to transfer an indication of the number of sub-blocks in the first subset and an identification of each sub-block in the first subset to the non-volatile memory controller in a fixed number of bytes.

Example 7 may include the system of any one of Examples 1 to 6, wherein the erase command is to identify the block of non-volatile memory.

Example 8 may include the system of any one of Examples 1 to 6, wherein the non-volatile memory controller is to document each sub-block in the first subset in a table.

Example 9 may include a memory device comprising a non-volatile memory to initiate an erase of a block of the non-volatile memory in response to an erase command, wherein the block is to include a plurality of sub-blocks. and a non-volatile memory controller communicatively coupled to the non-volatile memory, the non-volatile memory controller to track a failure of the erase with respect to a first subset of the plurality of sub-blocks on an individual sub-block basis, wherein the erase is to be successful with respect to a second subset of the plurality of sub-blocks.

Example 10 may include the device of Example 9, wherein the non-volatile memory controller is to permit use of the second subset of the plurality of sub-blocks.

Example 11 may include the device of Example 9, wherein the non-volatile memory controller is to prevent use of the first subset of the plurality of sub-blocks.

Example 12 may include the device of Example 9, wherein the non-volatile memory controller is to transfer an erase status enhanced command to the non-volatile memory and the non-volatile memory is to transfer an identification of each sub-block in the first subset to the non-volatile memory controller in response to the erase status enhanced command.

Example 13 may include the device of Example 9, wherein the non-volatile memory is to transfer an indication of the number of sub-blocks in the first subset and an identification of each sub-block in the first subset to the non-volatile memory controller in a variable number of bytes.

Example 14 may include the device of Example 9, wherein the non-volatile memory is to transfer an indication of the number of sub-blocks in the first subset and an identification of each sub-block in the first subset to the non-volatile memory controller in a fixed number of bytes.

Example 15 may include the device of any one of Examples 9 to 14, wherein the erase command is to identify the block of non-volatile memory.

Example 16 may include the device of any one of Examples 9 to 14, wherein the non-volatile memory controller is to document each sub-block in the first subset in a table.

Example 17 may include a method of operating a memory device, comprising initiating an erase of a block of non-volatile memory in response to an erase command, wherein the block includes a plurality of sub-blocks, tracking a failure of the erase with respect to a first subset of the plurality of sub-blocks on an individual sub-block basis, wherein the erase is successful with respect to a second subset of the plurality of sub-blocks.

Example 18 may include the method of Example 17, further including permitting use of the second subset of the plurality of sub-blocks.

Example 19 may include the method of Example 17, further including preventing use of the first subset of the plurality of sub-blocks.

Example 20 may include the method of Example 17, further including transferring an erase status enhanced command from a non-volatile memory controller to the non-volatile memory, and transferring an identification of each sub-block in the first subset from the non-volatile memory to the non-volatile memory controller in response to the erase status enhanced command.

Example 21 may include the method of Example 17, further including transferring an indication of the number of sub-blocks in the first subset and an identification of each sub-block in the first subset from the non-volatile memory to a non-volatile memory controller in a variable number of bytes.

Example 22 may include the method of Example 17, further including transferring an indication of the number of sub-blocks in the first subset and an identification of each sub-block in the first subset from the non-volatile memory to a non-volatile memory controller in a fixed number of bytes.

Example 23 may include the method of any one of Examples 17 to 22, wherein the erase command identifies the block of non-volatile memory.

Example 24 may include the method of any one of Examples 17 to 22, further including documenting each sub-block in the first subset in a table.

Example 25 may include a memory device comprising means for initiating an erase of a block of non-volatile memory in response to an erase command, wherein the block includes a plurality of sub-blocks, means for tracking a failure of the erase with respect to a first subset of the plurality of sub-blocks on an individual sub-block basis, wherein the erase is to be successful with respect to a second subset of the plurality of sub-blocks.

Example 26 may include the memory device of Example 25, further including means for permitting use of the second subset of the plurality of sub-blocks.

Example 27 may include the memory device of Example 25, further including means for preventing use of the first subset of the plurality of sub-blocks.

Example 28 may include the memory device of Example 25, further including means for transferring an erase status enhanced command from a non-volatile memory controller to the non-volatile memory, and means for transferring an identification of each sub-block in the first subset from the non-volatile memory to the non-volatile memory controller in response to the erase status enhanced command.

Example 29 may include the memory device of Example 25, further including means for transferring an indication of the number of sub-blocks in the first subset and an identification of each sub-block in the first subset from the non-volatile memory to a non-volatile memory controller in a variable number of bytes.

Example 30 may include the memory device of Example 25, further including means for transferring an indication of the number of sub-blocks in the first subset and an identification of each sub-block in the first subset from the non-volatile memory to a non-volatile memory controller in a fixed number of bytes.

Example 31 may include the memory device of any one of Examples 25 to 30, wherein the erase command is to identify the block of non-volatile memory.

Example 32 may include the memory device of any one of Examples 25 to 30, further including means for documenting each sub-block in the first subset in a table.

Techniques described herein may provide a NAND interface that achieves a reduction of redundancy for improved uncorrectable bit error rate and reduction in defect reserve overhead. Indeed, with 3D NAND, the isolation granularity for word line shorts may be isolated to a "tile" granularity that is much smaller than the size of a page. Since XOR redundancy may generally be used to protect against such a failure mode, techniques described herein may recognize the "tile" granularity and minimize the XOR overhead.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/ or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A system comprising:
a compute subsystem;
a communications interface coupled to the compute subsystem; and
a memory device coupled to the communications interface, the memory device including:
a non-volatile memory to initiate an erase operation for a block of the non-volatile memory in response to an erase command, wherein the block is to include a plurality of sub-blocks; and
a non-volatile memory controller communicatively coupled to the non-volatile memory, the non-volatile memory controller to track a failure of the erase operation for the block on an individual sub-block basis, wherein the non-volatile memory controller is to:
transfer, in response to an indication that the erase operation for the block failed, an erase status enhanced command to the non-volatile memory to obtain an identification made from the erase operation for the block of each individual sub-block in a first subset of the plurality of sub-blocks that failed to erase during the erase operation for the block; and
receive, from the non-volatile memory, a response to the erase status enhanced command including the identification made from the erase operation for the block of each individual sub-block in the first subset of the plurality of sub-blocks that failed to erase during the erase operation for the block.

2. The system of claim 1, wherein the non-volatile memory controller is to permit use of a second subset of the plurality of sub-blocks that successfully erased during the erase operation for the block.

3. The system of claim 1, wherein the non-volatile memory controller is to prevent use of each individual sub-block in the first subset of the plurality of sub-blocks that failed to erase during the erase operation for the block.

4. The system of claim 1, wherein a first field of the response to the erase status enhanced command is one byte of data and a second field of the response to the erase status enhanced command is a variable number of bytes or a fixed number of bytes.

5. The system of claim 1, wherein the non-volatile memory controller is to receive a communication to indicate the erase operation for the block did not fail, and wherein a number in a first field of the communication is zero and no useful data is in a second field of the communication.

6. The system of claim 1, wherein the erase command is to identify the block of the non-volatile memory.

7. The system of claim 1, wherein the non-volatile memory controller is to document in a table each individual sub-block in the first subset of the plurality of sub-blocks that failed to erase during the erase operation for the block.

8. A device comprising:
a non-volatile memory to initiate an erase operation for a block of the non-volatile memory in response to an erase command, wherein the block is to include a plurality of sub-blocks; and
a non-volatile memory controller communicatively coupled to the non-volatile memory, the non-volatile memory controller to track a failure of the erase operation for the block on an individual sub-block basis, wherein the non-volatile memory controller is to:
transfer, in response to an indication that the erase operation for the block failed, an erase status enhanced command to the non-volatile memory to obtain an identification made from the erase operation for the block of each individual sub-block in a first subset of the plurality of sub-blocks that failed to erase during the erase operation for the block; and
receive, from the non-volatile memory, a response to the erase status enhanced command including the identification made from the erase operation for the block of each individual sub-block in the first subset of the plurality of sub-blocks that failed to erase during the erase operation for the block.

9. The device of claim 8, wherein the non-volatile memory controller is to permit use of a second subset of the plurality of sub-blocks that successfully erased during the erase operation for the block.

10. The device of claim 8, wherein the non-volatile memory controller is to prevent use of each individual sub-block in the first subset of the plurality of sub-blocks that failed to erase during the erase operation for the block.

11. The device of claim 8, wherein the non-volatile memory controller is to receive a communication to indicate the erase operation for the block did not fail, and wherein a number in a first field of the communication is zero and no useful data is in a second field of the communication.

12. The device of claim 8, wherein a first field of the response to the erase status enhanced command is one byte of data and a second field of the response to the erase status enhanced command is in a variable number of bytes or a fixed number of bytes.

13. The device of claim 8, wherein the erase command is to identify the block of the non-volatile memory.

14. The device of claim 8, wherein the non-volatile memory controller is to document in a table each individual sub-block in the first subset of the plurality of sub-blocks that failed to erase during the erase operation for the block.

15. A method comprising:
initiating an erase operation for a block of non-volatile memory in response to an erase command, wherein the block includes a plurality of sub-blocks; and
tracking a failure of the erase operation for the block on an individual sub-block basis, wherein tracking the failure includes:
transferring, in response to an indication that the erase operation for the block failed, an erase status enhanced command from a non-volatile memory controller to the non-volatile memory to obtain an identification made from the erase operation for the block of each individual sub-block in a first subset of the plurality of sub-blocks that failed to erase during the erase operation for the block; and
receiving, at the non-volatile memory controller form the non-volatile memory, a response to the erase status enhanced command including the identification made from the erase operation for the block of each individual sub-block in the first subset of the plurality of sub-blocks that failed to erase during the erase operation for the block.

16. The method of claim 15, further including permitting use of a second subset of the plurality of sub-blocks that successfully erased during the erase operation for the block.

17. The method of claim 15, further including preventing use of each individual sub-block in the first subset of the plurality of sub-blocks that failed to erase during the erase operation for the block.

18. The method of claim 15, wherein the non-volatile memory controller is to receive a communication to indicate the erase operation for the block did not fail, and wherein a number in a first field of the communication is zero and no useful data is in a second field of the communication.

19. The method of claim 15, wherein a first field of the response to the erase status enhanced command is one byte of data and a second field of the response to the erase status enhanced command is a variable number of bytes or a fixed number of bytes.

20. The method of claim 15, wherein the erase command identifies the block of the non-volatile memory.

21. The method of claim 15, further including documenting in a table each individual sub-block in the first subset of the plurality of sub-blocks that failed to erase during the erase operation for the block.

22. The device of claim 8, wherein the response to the erase status enhanced command includes a first field having a total number of sub-blocks that are in error in the first subset of the plurality of sub-blocks and a second field including the identification made from the erase operation for the block of each individual sub-block in the first subset of the plurality of sub-blocks that failed to erase during the erase operation for the block.

23. The device of claim 8, wherein the non-volatile memory is to:
receive the erase command;
set all bits in the block to a predetermined value in response to the erase command;
read the bits in the block to determine whether the bits have the predetermined value; and
transfer, in response to a determination that the bits in the block do not have the predetermined value, the indication that the erase operation for the block failed.

24. The device of claim 23, wherein the predetermined value is a same bit value that is to be set for all the bits in the block.

* * * * *